United States Patent
Gopinath et al.

(10) Patent No.: US 12,224,761 B2
(45) Date of Patent: Feb. 11, 2025

(54) NOISE-SHAPING OF ADDITIVE DITHER IN ANALOG-TO-DIGITAL CONVERTERS

(71) Applicant: Texas Instruments Incorporated, Dallas, TX (US)

(72) Inventors: Nithin Gopinath, Bangalore (IN); Visvesvaraya A. Pentakota, Bangalore (IN); Neeraj Shrivastava, Bangalore (IN); Harshit Moondra, Mumbai (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/729,374

(22) Filed: Apr. 26, 2022

(65) Prior Publication Data

US 2023/0344436 A1    Oct. 26, 2023

(51) Int. Cl.
*H03M 1/20* (2006.01)
*H03M 1/06* (2006.01)

(52) U.S. Cl.
CPC ....... *H03M 1/0641* (2013.01); *H03M 1/0626* (2013.01)

(58) Field of Classification Search
CPC ...... H03M 1/0641; H03M 1/12; H03M 1/201; H03M 1/0626; H03M 1/0639; H03M 3/454; H03M 1/0614; H03M 3/3287; H03M 3/33; H03M 1/66; H03M 3/332; H03M 3/448; H03M 3/50; H03M 1/0854; H03M 1/661; H03M 3/458; H03M 1/0668
USPC ................................ 341/131, 143, 155, 144
See application file for complete search history.

(56) References Cited

U.S. PATENT DOCUMENTS

| | | | | |
|---|---|---|---|---|
| 4,831,464 A | * | 5/1989 | Chijiiwa | G11B 20/10527 360/32 |
| 6,320,526 B1 | * | 11/2001 | Gandolfi | H03M 3/3287 341/131 |
| 7,075,466 B1 | * | 7/2006 | Woodall | H03M 1/0629 341/131 |

(Continued)

OTHER PUBLICATIONS

Balistrieri et al., "A State of the Art on ADC Error Compensation Methods," vol. 1, Proc. of the 21st IEEE Instr. and Meas. Tech. Conf. (IEEE, 2004), pp. 711-716.

(Continued)

*Primary Examiner* — Linh V Nguyen
(74) *Attorney, Agent, or Firm* — Valerie M. Davis; Frank D. Cimino

(57) ABSTRACT

An analog-to-digital converter circuit module utilizing dither to reduce multiplicative noise. A dither generation circuit generates a noise-shaped analog dither signal having lower amplitudes at frequencies below a cutoff frequency than at frequencies above the cutoff frequency. The noise-shaped analog dither signal is added to the input analog signal to be converted and the summed signal applied to an analog-to-digital converter The dither generation circuit may be implemented as an analog dither generator followed by an analog high-pass filter. The dither generation circuit may alternatively be implemented digitally, for example with a digital noise-shaping filter applying a high-pass digital filter to a pseudo-random binary sequence. The digital dither generation circuit may alternatively be implemented by one or more 1-bit sigma-delta modulators, each generating a bit of a digital dither sequence that is converted to analog.

15 Claims, 8 Drawing Sheets

(56) References Cited

U.S. PATENT DOCUMENTS

| | | | | |
|---|---|---|---|---|
| 7,126,519 B1* | 10/2006 | Xu | H03M 1/0626 | 341/145 |
| 7,221,299 B2* | 5/2007 | Bjornsen | H03M 1/0641 | 341/131 |
| 7,295,140 B2* | 11/2007 | Chuang | H03M 3/34 | 341/143 |
| 7,443,324 B1* | 10/2008 | Muhammad | H03M 3/332 | 341/131 |
| 8,004,436 B2* | 8/2011 | Kapusta | H03M 1/0639 | 341/131 |
| 8,497,790 B1* | 7/2013 | Lewis | H03M 1/1019 | 341/120 |
| 8,508,395 B2* | 8/2013 | Song | H03M 1/0639 | 341/142 |
| 9,071,260 B2* | 6/2015 | Chiricosta | H03M 1/0639 | |
| 9,172,498 B2* | 10/2015 | Takatori | H04L 1/24 | |
| 9,312,840 B2* | 4/2016 | Dong | H03M 1/0626 | |
| 9,385,745 B1* | 7/2016 | Op 't Eynde et al. | H03F 3/505 | |
| 2017/0257108 A1* | 9/2017 | Straeussnigg | H03M 1/0854 | |
| 2022/0045686 A1* | 2/2022 | Kozlov | H03M 1/0641 | |

OTHER PUBLICATIONS

Carbone et al., "Dither signal effects on the resolution of nonlinear quantizers," 1993 IEEE Instr. and Meas. Tech. Conf. (IEEE, 1993), pp. 38-42.

Fetterman et al., "CMOS pipelined ADC employing dither to improve linearity," Proc. of the IEEE 1999 Custom Integrated Circ. Conf. (IEEE, 1999), pp. 109-112.

Holub et al., "Large scale error reduction in dithered ADC", vol. X, Proc. of 5 Imeko TC-4 EuroWorkshop on ADC Modelling and Testing (IEEE, 2000), pp. 171-176.

Pan et al., "Spectral spurs due to quantization in Nyquist ADCs," vol. 51, No. 8, IEEE Trans. on Circ. and Sys. (IEEE, 2004), pp. 1422-1439.

Liu et al., "An Optimum Condition of the Dithering Signal against the Quantization Noise in ADC," 2014 Int'l Conf. on Wireless Comm. and Sensor Network (IEEE, 2014), pp. 56-60.

Wannamaker et al., "A theory of nonsubtractive dither," vol. 48, No. 2, IEEE Trans. on Signal Proc. (IEEE, 2000) pp. 499-516.

Zhu et al., "Analysis and Design of a Large Dither Injection Circuit for Improving Linearity in Pipelined ADCs," vol. 27, No. 9, IEEE Trans. on Very Large Scale Integration (VLSI) Sys. (IEEE, 2019), pp. 2008-2020.

* cited by examiner

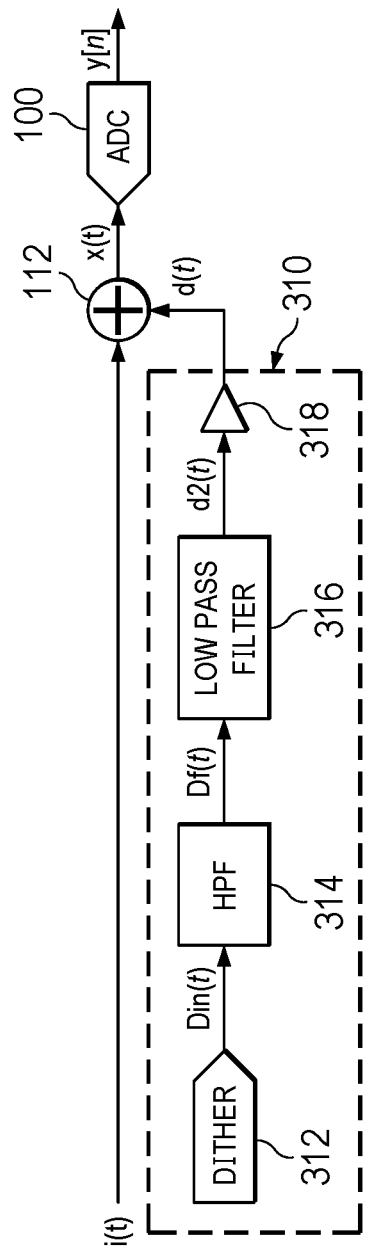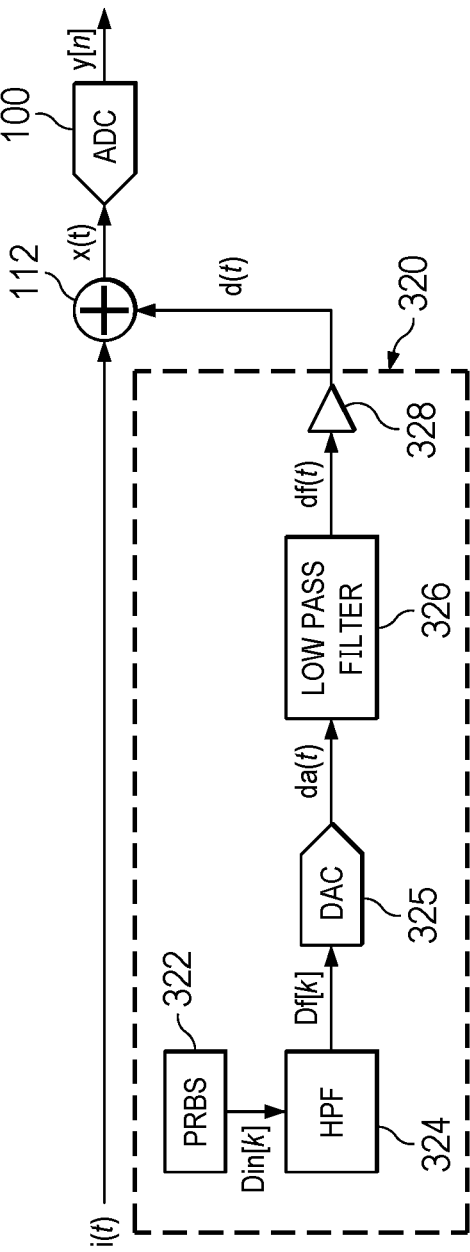
FIG. 3A
FIG. 3B

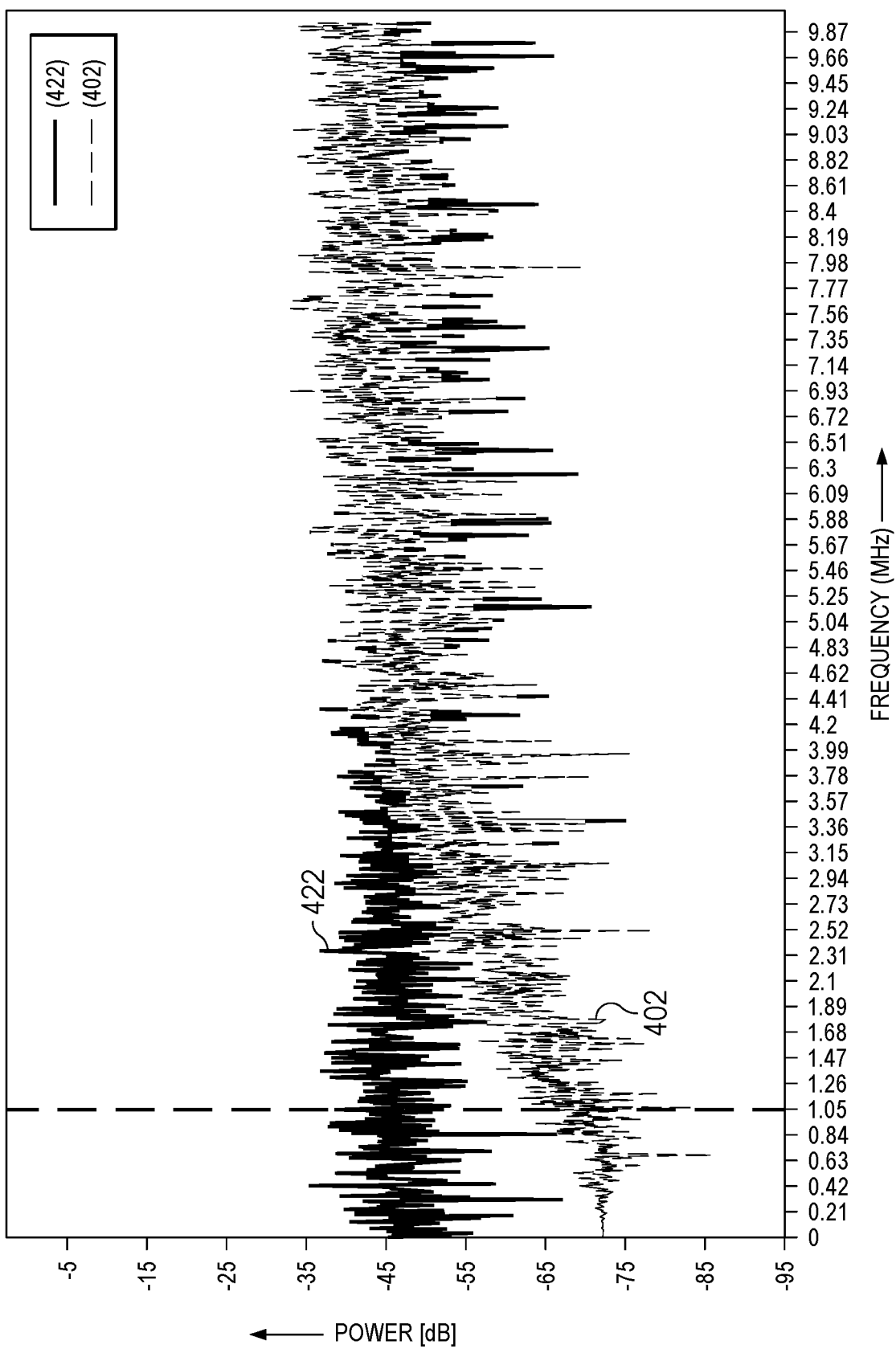

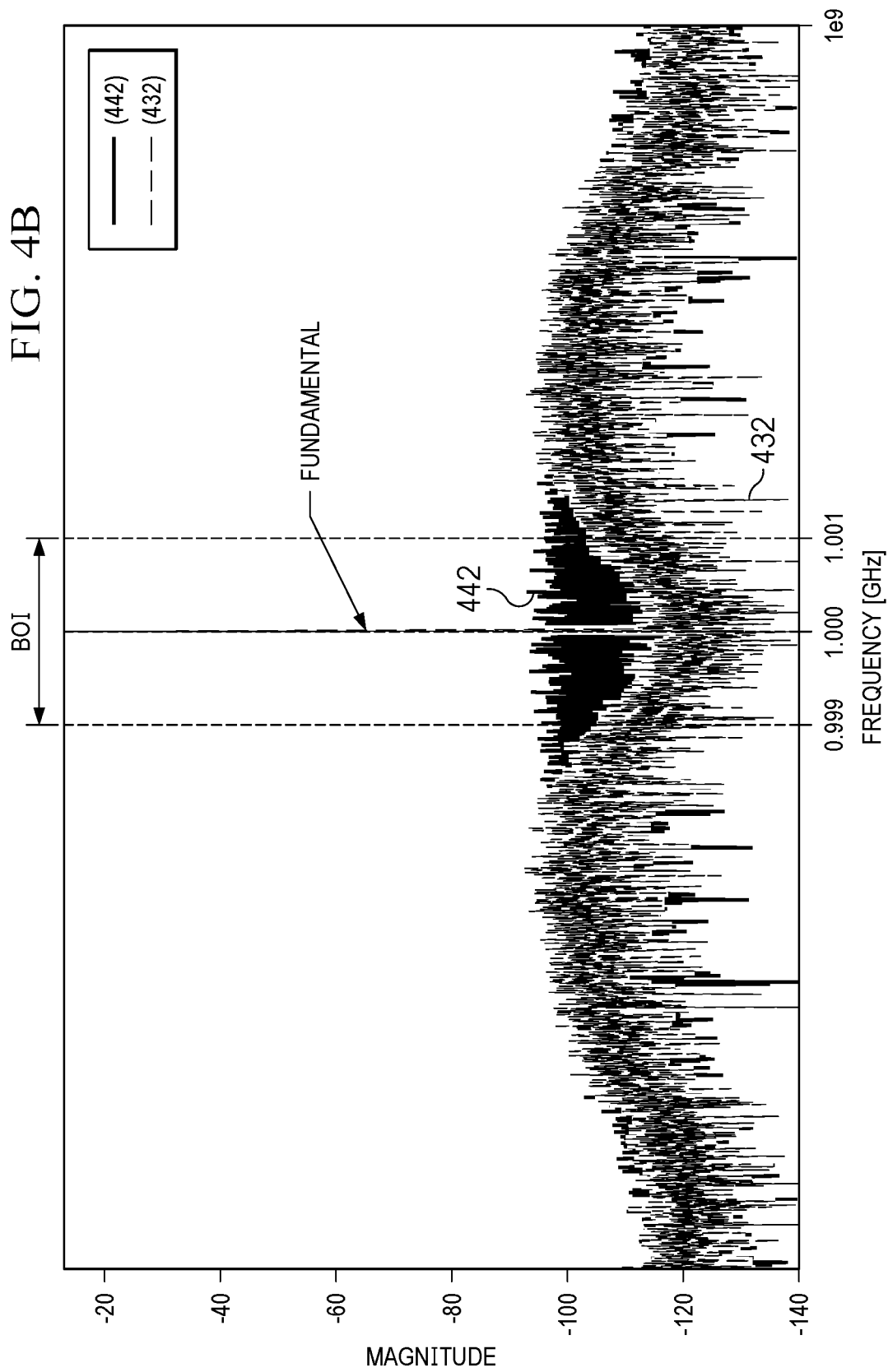

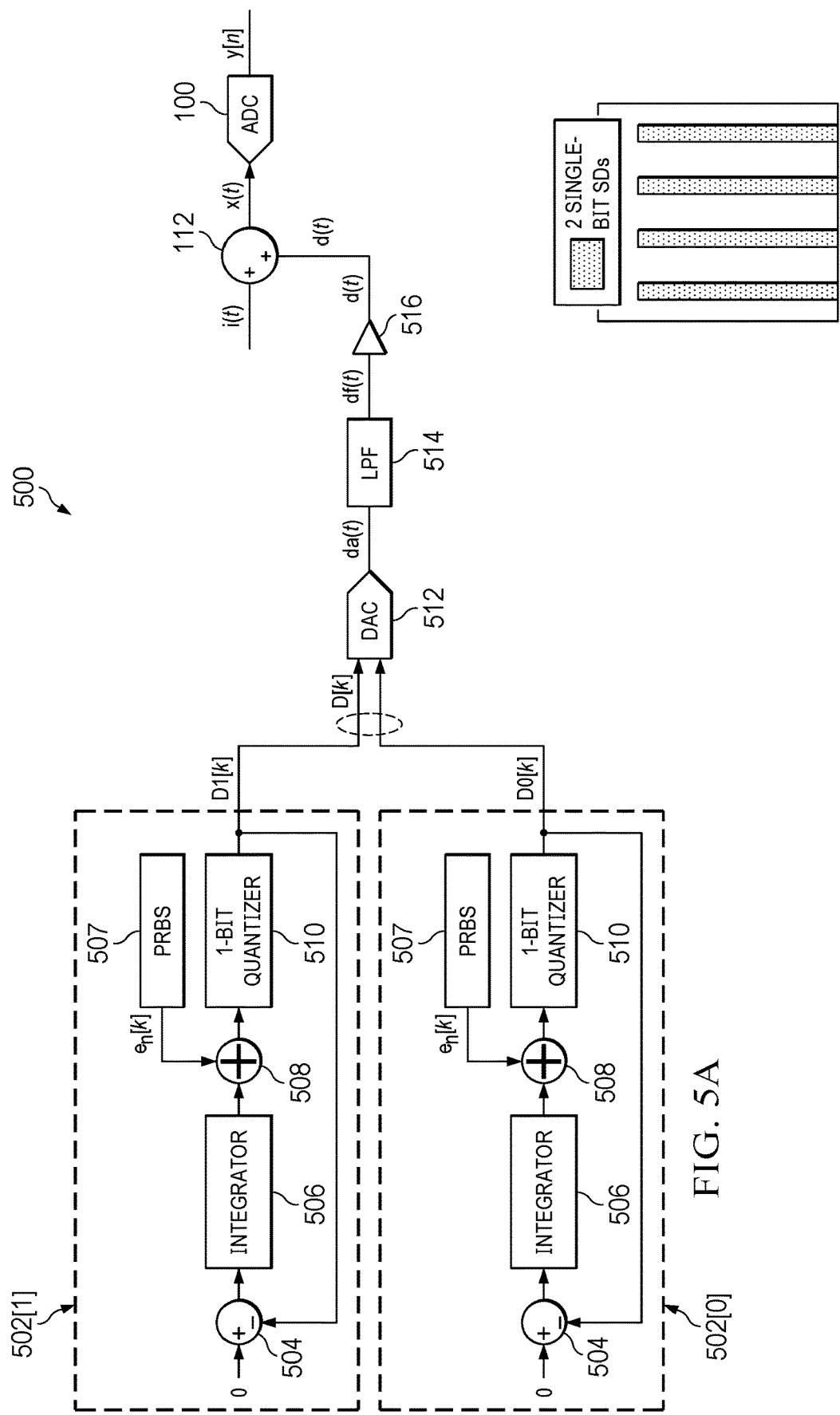

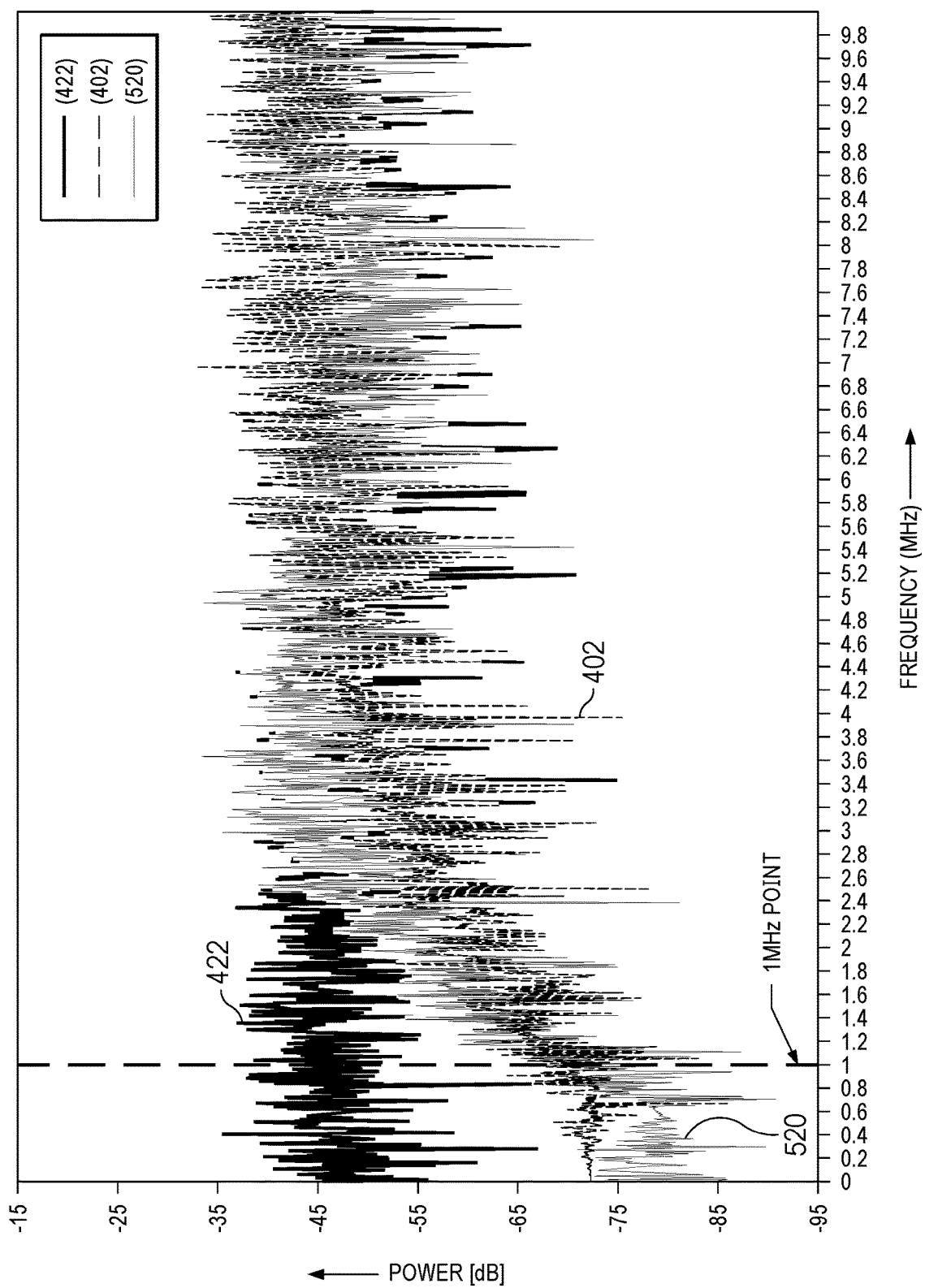

NOISE-SHAPING OF ADDITIVE DITHER IN ANALOG-TO-DIGITAL CONVERTERS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This relates to digital signal processing, and is more specifically directed to error compensation in the conversion of analog signals to digital data in such signal processing.

The application of modern signal processing systems to the physical world often involves the conversion of signals in the analog domain to digital data. Analog-to-digital converters (ADCs) refer to the system components that perform this conversion. Modern ADCs are implemented in a variety of architectures and approaches, providing a wide range of ADC performance in metrics such as resolution, bandwidth, precision, power consumption, and operating temperature range. One may select from among this variety of ADC approaches according to the intended system application and function, such as in data acquisition, communications, instrumentation, signal processing interfacing, and the like.

The compensation or correction of error is a concern in any of these ADC architectures. Beyond error due to variations and non-idealities in the actual circuit implementation and operating conditions, sampling error and quantization error are inherent in any analog-to-digital conversion. Sampling error refers to inaccuracy in the representation of the actual analog signal by the sequence of samples obtained at discrete times. Quantization error refers to the difference between the actual analog input signal amplitude and the nearest available digital value at each sampling instant from the ADC, and is generally characterized as non-linearity error.

A traditional technique used to reduce quantization error in ADCs is the addition of "dither," or random noise, to the input signal prior to quantization. The added dither may be in the form of analog noise, or may be a digital pseudo-random pattern that is converted to analog prior to combining with the analog input signal. To the extent that the quantization error of the ADC is dependent on the input signal, the addition of dither to the input signal can remove this deterministic link, and thus improve the linearity of the ADC. Some conventional systems apply "large-signal" dither to the input signal, where the dither has an amplitude greater than $1/10^{th}$ of the full scale amplitude of the ADC. Such large-signal dither has been observed to attain a significant improvement in the important metric of spurious-free dynamic range (SFDR), defined as the ratio of the fundamental signal to the largest spurious signal component.

However, the dither added to the input signal is itself additional noise, and can affect the signal to noise ratio (SNR) of the ADC. In some implementations that add wideband dither to the input signal, a digital representation of the inserted dither is subtracted from the digital output of the ADC to reduce the effect of the dither noise. In other implementations, the added dither is band-limited to frequencies outside of the frequencies of interest, typically by a low pass filter restricting the dither to lower frequencies (e.g., 0-100 MHz in RF applications). Such band-limiting of the dither eliminates the need for subtraction at the output.

It is within this context that the embodiments described herein arise.

BRIEF SUMMARY OF THE INVENTION

According to one aspect, an analog-to-digital converter module includes an analog-to-digital converter (ADC) having an analog input coupled to an adder, and receiving an input analog signal combined with an analog dither signal. A dither generation circuit generates a noise-shaped analog dither signal having lower amplitudes at frequencies below a cutoff frequency than at frequencies above the cutoff frequency According to another aspect, a circuit includes an ADC an analog-to-digital converter (ADC) having an analog input coupled to an adder, and receiving an input analog signal combined with an analog dither signal. A dither generation circuit includes a digital circuit configured to generate a pseudo-random binary sequence (PRBS), a digital noise-shaping filter configured to apply a high-pass filter characteristic to the PRBS, and a digital-to-analog converter (DAC) configured to convert the digital dither sequence to the analog digital dither signal.

According to another aspect, a circuit includes an ADC an analog-to-digital converter (ADC) having an analog input coupled to an adder, and receiving an input analog signal combined with an analog dither signal. A dither generation circuit for includes one or more 1-bit sigma-delta modulators, each generating a bit in each of a plurality of words in a digital dither sequence, and a digital-to-analog converter (DAC) configured to convert the digital dither sequence to an analog digital dither signal.

Technical advantages enabled by one or more of these aspects may include an ADC circuit module in which band-limited dither for addition to an analog input signal can be generated to reduce multiplicative noise in the power spectrum of the output digital sequence, specifically to reduce phase noise at frequencies close-in to a fundamental or carrier tone in the input signal, while providing good improvement in spurious-free dynamic range (SFDR) performance.

Other technical advantages enabled by the disclosed aspects will be apparent to those of ordinary skill in the art having reference to the following specification together with its drawings.

BRIEF DESCRIPTION OF THE SEVERAL VIEWS OF THE DRAWING

FIG. 3A is an electrical diagram, in block form, of an analog-to-digital converter (ADC) circuit module including an analog dither generation circuit according to an example embodiment.

FIG. 3B is an electrical diagram, in block form, of an analog-to-digital converter (ADC) circuit module including a digital dither generation circuit according to an example embodiment.

FIG. 4A is an example power spectrum plot for a dither signal generated by a digital dither generation circuit according to the example embodiment of FIG. 3B, as compared with the power spectrum produced from a pseudorandom binary sequence (PRBS).

FIG. 4B illustrates a power spectrum plot for digital output sequence generated by an ADC circuit module from an RF input signal with dither generated by a digital dither generation circuit according to the example embodiment of FIG. 3B, as compared with the power spectrum using dither generated from a PRBS.

FIG. 5A is an electrical diagram, in block form, of an analog-to-digital converter (ADC) circuit module including a digital dither generation circuit according to another example embodiment.

FIG. 5B illustrates a power spectrum plot for digital output sequence generated by an ADC circuit module from an RF input signal with dither generated by a dither generation circuit according to the example embodiment of FIG. 5A, as compared with the power spectra shown in FIG. 4B.

FIG. 5C is a normalized dither histogram of quantization probability for a digital dither sequence generated by a digital dither generation circuit according to the example embodiment of FIG. 5A.

The same reference numbers or other reference designators are used in the drawings to illustrate the same or similar (in function and/or structure) features.

DETAILED DESCRIPTION OF THE INVENTION

The one or more embodiments described in this specification are implemented into an analog-to-digital converter (ADC) circuit module utilizing band-limited dither, as it is contemplated that such implementation is particularly advantageous in that context. However, it is also contemplated that aspects of these embodiments may be beneficially applied to ADCs of other architectures, as well as in other applications involving the quantization of analog signal levels. Accordingly, it is to be understood that the following description is provided by way of example only and is not intended to limit the true scope of this invention as claimed.

Figure 1:
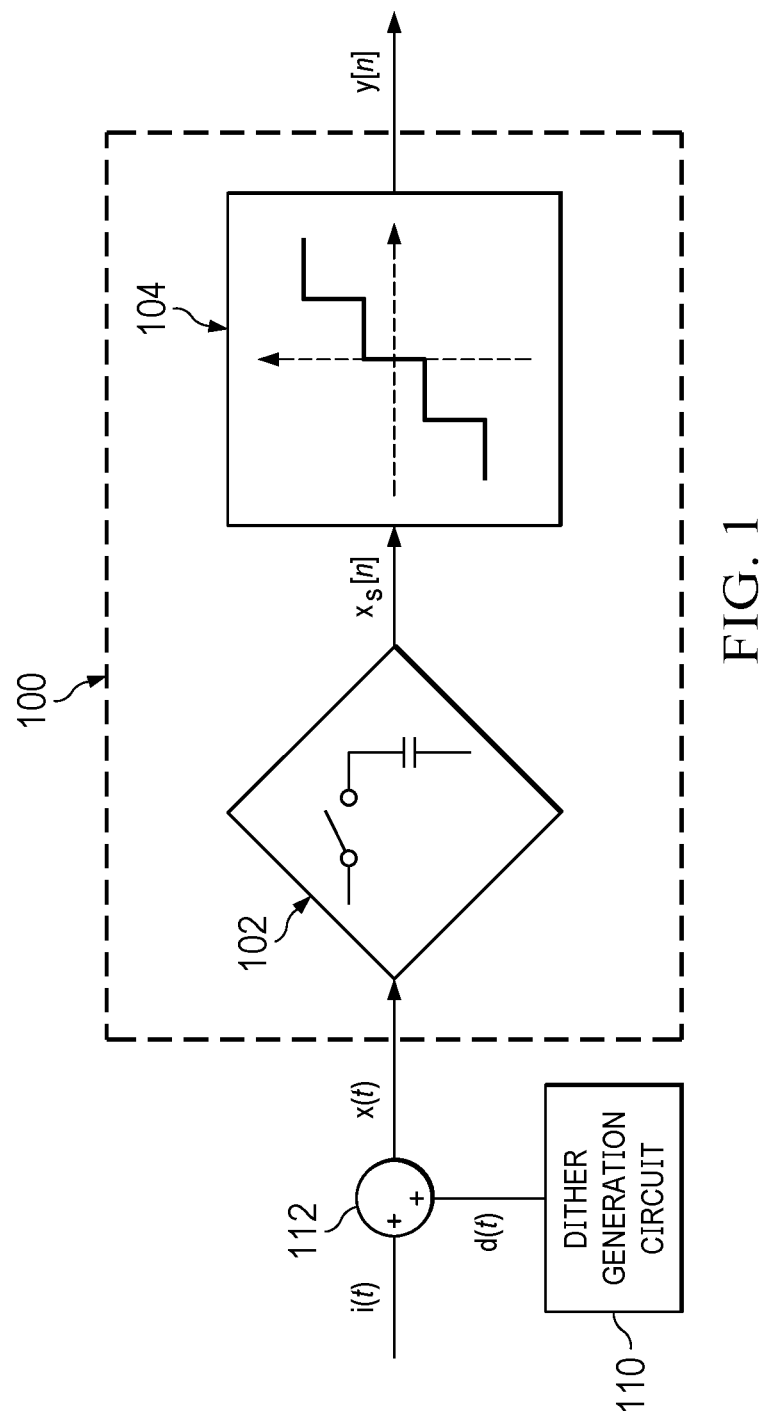
FIG. 1 is an electrical diagram, in block form, of an analog-to-digital converter (ADC) circuit module according to example embodiments.

FIG. 1 illustrates an ADC circuit module in which example embodiments may be implemented. The ADC circuit module of FIG. 1 may be implemented as a system, subsystem, or functional block or module in a large scale integrated circuit, such as a microcontroller, semi-custom or application-specific integrated circuit, or the like; alternatively, the ADC circuit module may itself be realized as a separate ADC integrated circuit. Other implementations of the ADC circuit module are contemplated and will be apparent to those skilled in the art. In the example of FIG. 1, the ADC circuit module includes an ADC 100 in a generalized form as including a sample-and-hold amplifier (SHA) circuit 102 followed by a quantizer 104. SHA 102 receives an input analog time-varying signal x(t), and samples that signal x(t) at a sampling frequency $f_s$ to create sample sequence $x_s[n]$, where n is the index of a given value in the sequence. Quantizer 104 operates to generate an output sequence y[n] of digital codes, each code word having k bits and representative of the analog value of each sample in sequence $x_s[n]$. The number k of bits in each code word of output sequence y[n] may range from 1 bit to as many as sixteen bits in modern ADCs.

According to these example embodiments, the analog signal x(t) input to SHA 102 is generated by adder 112, which adds a dither signal d(t) generated by dither generation circuit 110 to the actual input signal i(t). Adder 112 may be implemented, for example, as an operational amplifier (op amp) circuit with inputs receiving the input signal i(t) and the dither signal d(t), and configured to produce analog signal x(t) based on a sum of signals i(t) and d(t) at its output. As discussed above, the addition of dither signal d(t) to the input signal i(t) improves the linearity of ADC 100, specifically by reducing quantization error that is deterministically linked to the input signal x(t).

According to these example embodiments, the application of dither signal d(t) is non-subtractive, in that the dither applied at the input is not then subtracted from the values of output sequence y[n]. To avoid degradation of the signal-to-noise ratio (SNR) from this non-subtractive dither, dither generation circuit 110 includes a filter to band-limit the dither signal d(t) to frequencies that are not of interest in the system in which ADC 100 is implemented. For the example of analog-to-digital conversion of a radio frequency (RF) signal having a carrier frequency $f_c$ of on the order of 1 GHz, dither generation circuit 110 may include a low-pass filter with a cutoff frequency of on the order of 100 MHz, such that the spectrum of dither signal d(t) is generally limited to frequencies below 100 MHz. In many applications, including RF applications, the amplitude of dither signal d(t) can be significant, for example on the order of 10% of the full scale (FS) range of ADC 100.

Figure 2:
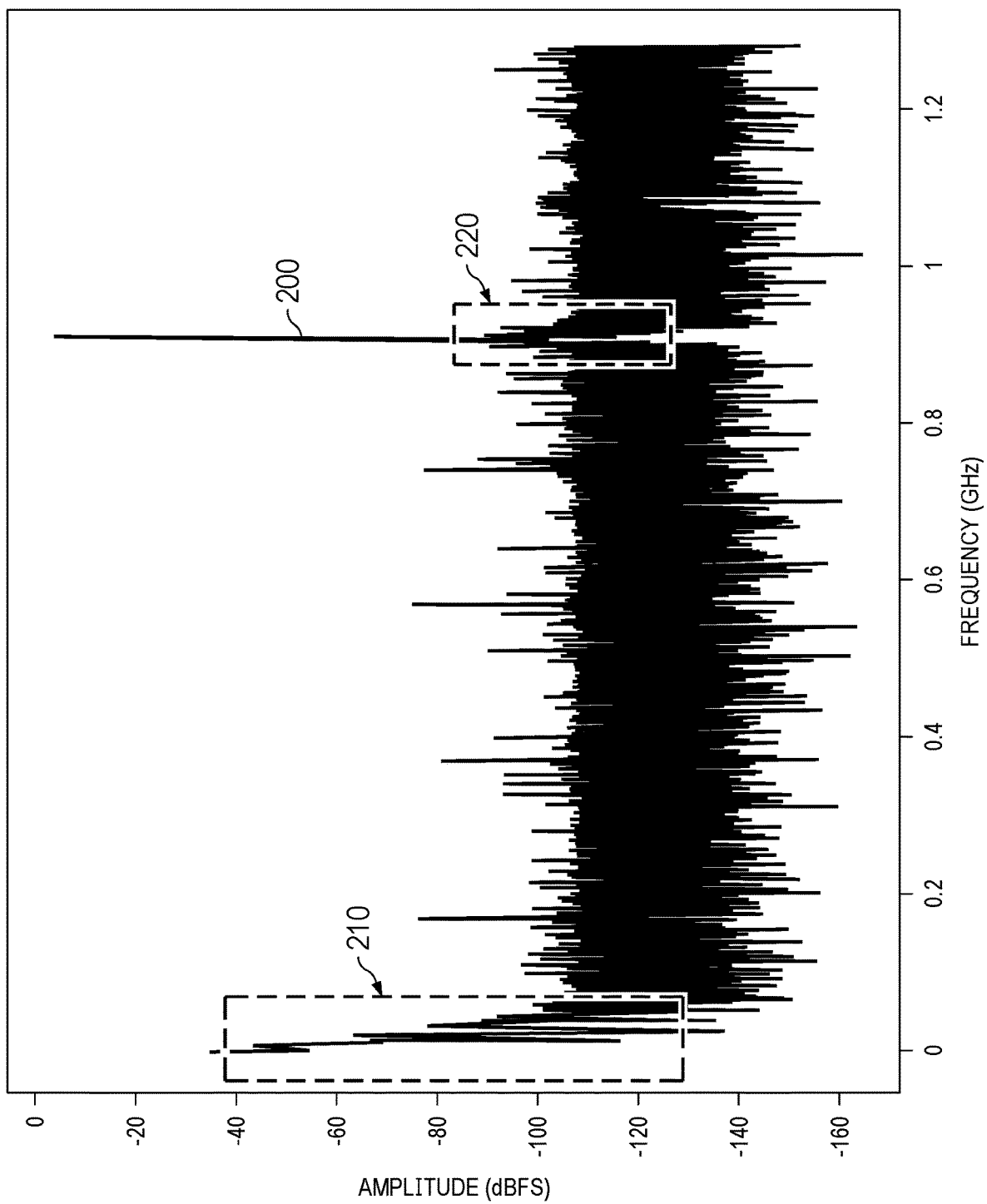
FIG. 2 is a power spectrum plot for a digital sequence generated by a conventional ADC circuit module from an RF input signal.

It has been observed, however, that spurious frequency components can be produced by the addition of large-signal (e.g., >10% of FS) dither, even if band-limited by a low-pass filter. FIG. 2 illustrates an example of a frequency spectrum, obtained by Fast Fourier Transform (FFT), of an example output sequence y[n] generated from an RF input signal i(t) with a carrier frequency $f_c$ of about 900 MHz into which a dither signal d(t) bandlimited to 100 MHz is applied. In the spectrum of FIG. 2, spike 200 illustrates the amplitude of the fundamental frequency (e.g., carrier frequency $f_c$) of input signal i(t) at about 900 MHz. The spectrum of band-limited dither signal d(t) is shown in FIG. 2 by region 210, with significant amplitudes at frequencies between 0 and about 100 MHz. However, as evident from region 220 of the spectrum of FIG. 2, phase noise is present in the output stream y[n] at frequencies "close-in" to the fundamental, or carrier, frequency. The second harmonic distortion (HD2) of ADC 100 is believed to cause intermodulation of the dither signal d(t) with the input signal i(t) that, along with the leakage of dither signal d(t) into common mode due to imbalance between positive and negative amplitudes (P/M imbalance) at the input circuit, can modulate the sampling instant of ADC 100. The resulting multiplicative noise (e.g., "beating") of the dither signal with the input signal frequency appears as phase noise, evident in region 220 of FIG. 2.

According to these example embodiments, noise "shaping" is applied in the generation of the dither signal d(t) in order to avoid this close-in phase noise at frequencies near the fundamental frequency of the signal being converted. In some embodiments, this noise shaping is implemented in the form of a high pass filter, with characteristics selected so that the resulting filtered dither attains a desired histogram distribution following quantization in the ADC. In other embodiments, a digital dither with the desired noise characteristics and distribution is generated and applied.

FIG. 3A and FIG. 3B illustrate example architectures of an analog-to-digital converter circuit module for converting an input analog signal i(t) to a sequence y(n) of digital code words. In each of these examples, the analog-to-digital conversion is performed by ADC 100, which in this example may be constructed according to any one of a number of architectures, including, for example, pipelined A/D converters, successive approximation register A/D converters, sigma-delta ADCs (also referred to as delta-sigma ADCs), all-digital converters, scan conversion-based transient digitizers, and the like. Regardless of the type and construction of ADC 100, dither is applied to the analog signal being converted by adder 112, which receives input signal i(t) at one input and a time-varying dither signal d(t) at another input.

In the example architecture of FIG. 3A, the dither signal d(t) is generated by an analog dither generation circuit 310. Dither generation circuit 310 includes dither generator 312, which generates an analog dither signal at its output with the desired amplitude and frequency characteristics. Examples of an analog dither generator 312 suitable for use in this implementation include circuits based on noise diodes, amplifier circuits arranged to amplify the input voltage noise of a wideband bipolar op amp, and the like. In each case, the analog signal generated at the output of dither generator 312 is a wideband time-varying signal. According to this example embodiment, the output of dither generator is coupled to an input of analog noise shaping filter 314, which is constructed to filter the wideband signal from dither generator 312 according to a frequency characteristic selected to reduce the close-in phase noise of the added dither signal d(t) relative to the fundamental tone (e.g., carrier signal) of input signal i(t). For example, noise-shaping filter 314 may be a second-order high pass analog filter, with a cutoff frequency selected to remove the primary components of the close-in phase noise around the fundamental tone of input analog signal i(t). For the example described above relative to FIG. 2 in which the fundamental tone of input signal i(t) is about 900 MHz and is affected by close-in phase noise at frequencies within about 1 MHz of that fundamental frequency, the cutoff frequency of noise-shaping filter 314 may be selected to be at about 1 MHz.

The filtered output from noise-shaping filter 314 is applied to an input of low pass analog filter 316, which removes dither frequency components above a frequency of interest in the end system application (e.g., above at least the frequency of the fundamental tone). The filtered output d2(t) from low pass filter 316 is amplified to the desired amplitude by amplifier 318, and applied as dither signal d(t) to adder 112.

In the alternative to the arrangement shown in FIG. 3A, noise-shaping filter 314 and low-pass filter 316 may be reversed in order, such that the wideband output from dither generator 312 is first filtered by low-pass filter 316 and then filtered by noise-shaping filter 314. Other variations to the particular implementation shown in FIG. 3A will be apparent to those skilled in the art having reference to this specification.

According to another example embodiment, as shown in FIG. 3B, the ADC circuit module includes digital dither generation circuit 320. In this example, pseudorandom binary sequence (PRBS) generator 322 is constructed and operates to generate a digital PRBS Din[k] at a desired sample rate, from which dither signal d(t) is generated. PRBS generator 322 may be constructed as dedicated custom or semi-custom circuitry for generating the digital sequence, or alternatively may be implemented in programmable circuitry executing program instructions for generating the desired random sequence. The generated PRBS Din[k] is then applied to digital noise-shaping filter 324, which in this example is implemented as a digital filter configured to attain the desired frequency characteristic. For example, and as will be described in further detail below, the filter characteristic of digital noise-shaping filter 324 may be that of a second-order high-pass filter, with a cutoff frequency selected to remove the primary components of the close-in phase noise around the fundamental tone of input analog signal i(t). Digital noise-shaping filter 324 accordingly produces noise-shaped sequence Df[k] at its output, which is coupled to an input of digital-to-analog converter (DAC) 325. DAC 325 is constructed and operates to convert the noise-shaped digital sequence Df[k] to an analog signal da(t) at its output, which is coupled to the input of analog low pass filter 326. As in the analog example of FIG. 3A, low pass filter 326 is configured to remove frequency components above a frequency of interest in the end system application (e.g., above at least the frequency of the fundamental tone), producing filtered analog dither signal df(t) at its output, which is coupled to an input of amplifier 328. Amplifier 328 amplifies signal df(t) at its input to produce dither signal d(t) at an amplitude reasonably matching the full-scale range of ADC 100. Dither signal d(t) is applied to an input of adder 112 for combining with input signal i(t) to produce the dithered input signal x(t) that is converted to digital by ADC 100 as described above.

As noted above, digital noise-shaping filter 324 is arranged to apply the desired noise shaping (e.g., high-pass filter characteristics) to reduce intermodulation of the dither signal d(t) with harmonics of the fundamental tone, and thus reduce close-in phase noise at frequencies near the fundamental tone. FIG. 4A illustrates a frequency spectrum 402 of dither signal d(t) as generated from simulation of an example implementation of the architecture of FIG. 3B in an end application in which the carrier frequency of input signal i(t) is around 1 GHz, and in which the ADC circuit module is sensitive to phase noise within 1 MHz of that carrier frequency. In this example, digital noise-shaping filter 324 applies a second order high-pass digital filter characteristic $(1-z^{-1})^2$ to a dither sequence Din[k] generated by PRBS generator 322 of a one-bit PRBS sequence {−1, +1}. As shown in FIG. 4A, the noise-shaping provided by filter 324 in this example results in a dither spectrum 402 in which the power at and below 1 MHz is on the order of 30 dB lower than at higher frequencies (e.g., 5 MHz and higher). For comparison, a dither signal d(t) generated from a 2-bit PRBS sequence but not filtered by a noise-shaping filter exhibits a relatively flat average power spectrum 422 over frequency, including at frequencies 1 MHz and below. Application of a dither signal d(t) with the relatively flat spectrum plot 422 of FIG. 4A can result in close-in phase noise at frequencies near the fundamental or carrier tone, such as shown by noise region 220 of FIG. 2 discussed above.

For example, FIG. 4B illustrates the power spectrum 432 of a digital output sequence y[n] generated by ADC 100 in simulation of the architecture of FIG. 3B for the case of a 1-bit PRBS dither sequence noise-shaped by digital filter 324 to produce dither signal d(t) with spectrum 402 shown in FIG. 4A. As evident from FIG. 4B, spectrum 432 includes a peak at a fundamental frequency of 1 GHz and reduced amplitudes at frequencies within a band of interest BOI of ±1 MHz on either side of that fundamental tone. In contrast, FIG. 4B illustrates power spectrum 442 for the digital sequence y[n] produced by ADC 100 for the case of a digital dither signal d(t) of a 2-bit PRBS without noise-shaping (spectrum 422 of FIG. 4A). As evident from FIG. 4B, this power spectrum 442 exhibits significant noise amplitude within the band of interest BOI.

An important measure of signal quality for ADC circuit modules is the spurious-free dynamic range (SFDR), which can be defined as a ratio of the strength of the fundamental tone to that of the strongest spurious signal within the frequency band of interest. More specifically, the SFDR of an ADC corresponds to the ratio of the RMS signal amplitude (e.g., at the fundamental tone) to the RMS value of the peak spurious spectral component at the ADC output. It has been observed through simulation that a noise-shaping digital filter 324 with a second order high-pass digital filter characteristic $(1-z^{-1})^2$, applied to a one-bit PRBS sequence $\{-1, +1\}$ generated by PRBS generator 322, produces a dither signal d(t) with the spectrum 402 of FIG. 4A that, added to the analog input signal, can improve the SFDR for the ADC circuit module by on the order of 30 dB, while limiting phase noise at frequencies close-in to the fundamental signal tone.

Figure 4C:
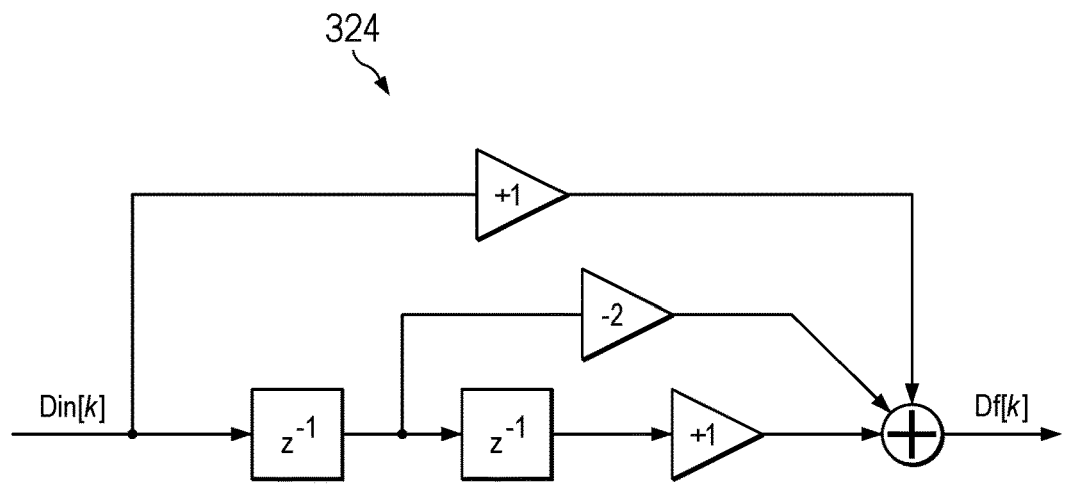
FIG. 4C is a z-domain representation of a noise-shaping filter in a digital dither generation circuit according to the example embodiment of FIG. 3B.

FIG. 4C illustrates digital filter characteristic $(1-z^{-1})^2$ as a z-transform representation of a noise-shaping digital filter 324 configured as a second-order high-pass filter. As noted above, this high-pass filter characteristic has been observed to reduce multiplicative close-in noise in the band of interest close-in to the fundamental tone of the input signal, and as a result provide good SFDR without compromising on close-in phase noise.

Figure 4D:
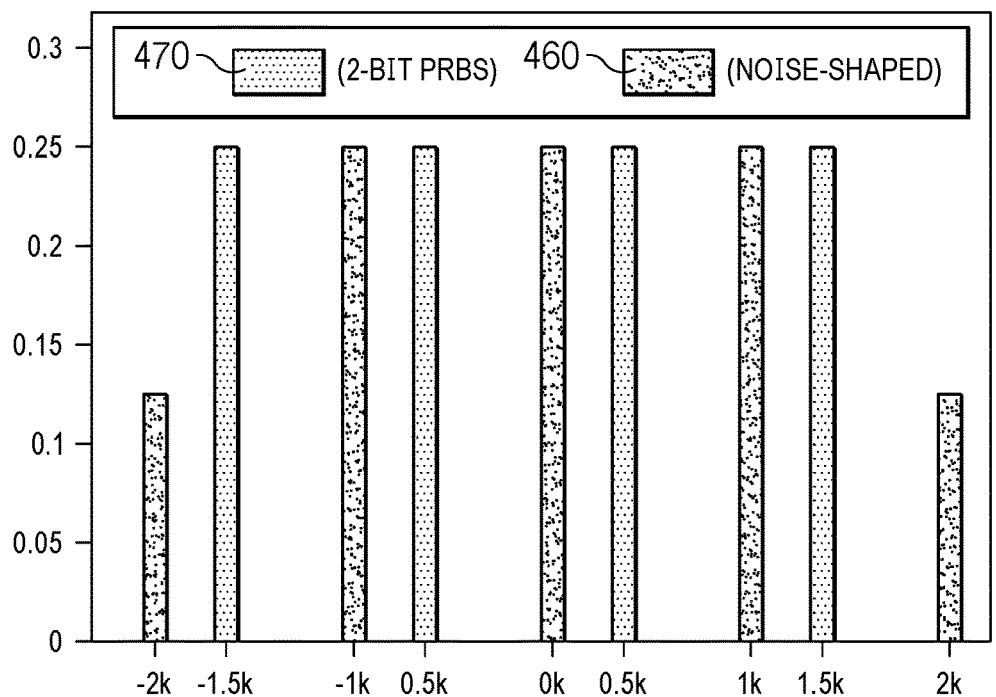
FIG. 4D is a normalized dither histogram of quantization probability for a digital dither sequence generated by a digital dither generation circuit according to the example embodiment of FIG. 3B, as compared with the power spectrum using dither generated from a PRBS.

FIG. 4D illustrates a normalized histogram 470 of a digital dither sequence generated from a 2-bit PRBS, without filtering by a noise-shaping digital filter, scaled over the full-scale range of ADC 100 (e.g., the quantization levels spaced apart by k code values over full-scale). As evident from FIG. 4D, histogram 470 exhibits four quantization levels: $\{-3, -1, +1, +3\}$ with uniform distribution of values over those four quantization levels. In contrast, the quantization pattern produced from digital filter 324 of FIG. 4C, applying a second-order high pass filter characteristic $(1-z^{-1})^2$ to a one-bit PRBS sequence $\{-1, +1\}$, produces an output sequence Df[k] having five output quantization levels: $\{-4, -2, 0, +2, +4\}$ with a non-uniform distribution. FIG. 4D illustrates normalized histogram 460 of this output sequence Df[k] from digital filter 324 over these five quantization levels, scaled over the full-scale range of ADC 100. As shown in FIG. 4D, the number of values at the $-2$ k and $+2$ k quantization levels in normalized histogram 460 is one-half that of the number of values at the $-1$ k, 0 k, and $+1$ k quantization levels. This five-level and non-uniform characteristic of histogram 460, resulting from noise-shaping filter 324 in this example embodiment, has an effect of reducing the maximum input signal amplitude that can be supported by ADC 100, as compared with the maximum input signal amplitude that could be supported for the case of a dither sequence exhibiting a uniform four-level characteristic. This reduction in the maximum supported input signal amplitude can limit the achievable SFDR performance of the ADC circuit module.

According to an alternative example embodiment, the SFDR and SNR performance of an ADC circuit module can be further optimized by frequency shaping a digital dither sequence that, when converted to analog, produces a uniform distribution of values over the available quantization levels. According to one alternative example embodiment, this combination can be attained by the use of one or more sigma-delta modulators to generate the digital dither sequence. More specifically, each sigma-delta modulator generates one bit of each value in a digital dither sequence that, upon conversion to analog by a DAC, produces a frequency-shaped dither signal that is both noise-shaped and exhibits a uniform histogram over its quantization levels.

Referring to FIG. 5A, the construction and operation of an ADC circuit module including dither generation circuit 500 according to an example of this alternative embodiment is described. In this example, dither generation circuit 500 includes two 1-bit sigma-delta modulators 502[1], 502[0]. In this example, sigma-delta modulators 502[1], 502[0] each generate one bit D1[k], D0[k], respectively, of a digital word produced in each sampling period k (e.g., with D1[k] and D0[k] as the MSB and LSB, respectively). The digital sequence D[k] is converted to an analog signal da(t) by DAC 512. The converted analog signal da(t) is low-pass filtered by analog low-pass filter 514 in this example, and the resulting filtered signal df(t) is amplified by amplifier 516 to produce the dither signal d(t). As shown in the architecture of FIG. 5A, this dither signal is added by adder 112 to the input signal i(t) to produce combined analog signal x(t), which in turn is applied to an input of ADC 100 for conversion to digital output sequence y[n].

Each of sigma-delta modulators 502[1], 502[0] includes an adder 504 with a positive input receiving an input level (e.g., at 0 V) and a negative input receiving feedback from the modulator output. Referring to modulator 502[1] by example, adder 504 has an output coupled to an input of an integrator 506, which applies a selected transfer function including an integration to the signal from adder 504. For example, the transfer function applied by integrator 506 may be of a low pass type. The output of integrator 506 is coupled to an input of adder 508. To attain the desired noise-shaping, modulator $502_1$ includes a 1-bit PRBS generator 507, which generates an unshaped pseudo-random noise sequence $e_n[k]$ within the sigma-delta loop, applied in this example to another input of adder 508. The summed signal at the output of adder 508 is applied to the input of 1-bit quantizer 510 at each sampling period. Quantizer 510 quantizes the summed output from adder 508, to produce a sequence of bits D1 [k] at its output at a binary level (e.g., either $-1$ or $+1$) from the signal at its input at the sampling rate of the modulator. The output D1[k] is applied as feedback to the negative input of adder 504, such that the difference signal applied by adder to integrator 506 represents a difference between the previous output value (e.g., D1 [k$-$1]) and the 0 level at the input. Accordingly, each of modulators 502[0], 502[1] operates to generate a random sequence of $-1$ and $+1$ values at its sampling rate.

According to this example embodiment, output sequence D[k] generated by the combination of sigma-delta modulators 502[0], 502[1] will exhibit a high-pass characteristic, with the particular cutoff frequency and other characteristics determined by the modulator sampling frequency and loop transfer function. More specifically, modulators 502[1], 502[0] will generate a random sequence of $-1$ and $+1$ values with a power spectrum dominated by higher frequencies, as determined by the sampling frequency and by the transfer function of integrators 506. In other words, the digital sequence D[k] generated by the modulators 502[1], 502[0] in this example of FIG. 5A will produce a noise-shaped digital dither sequence D[k] from which the eventual dither signal d(t) is produced by DAC 512, low-pass filter 514 and amplifier 516. This noise-shaping provided by dither generation circuit 500 can limit the close-in phase noise relative to the fundamental tone in its ADC circuit module in similar manner as the high-pass filtered implementations described above relative to FIG. 4A and FIG. 4B.

FIG. 5B illustrates a frequency spectrum 520 of dither signal d(t) as generated from an example implementation of the architecture of FIG. 5A in an end application in which the carrier frequency of input signal i(t) is around 1 GHz, and in which the ADC circuit module is sensitive to phase noise within 1 MHz of that carrier frequency. In this example, as described above, sigma-delta modulators 502[1], 502[0] produce random bit sequences D1[k], D0[k], respectively, and thus together produce a sequence D[k] of 2-bit digital words that has a high-pass frequency spectrum. Accordingly, the dither signal d(t) produced by DAC 512, low-pass filter 514 and amplifier 516 exhibits a noise-shaped power spectrum 520 that, when applied to analog input signal i(t) and quantized by ADC 100, can reduce the phase noise at frequencies close-in (within 1 MHz) of a fundamental tone in input signal i(t). As shown in FIG. 5B, power spectrum 520 is similar in shape to dither spectrum 402 (from FIG. 4A), which corresponds to a second order high-pass digital filter characteristic $(1-z^{-1})^2$ applied to a one-bit PRBS sequence $\{-1, +1\}$. According to this implementation of FIG. 5A, dither spectrum 520 exhibits power levels for frequencies at and below 1 MHz on the order of 30 dB lower than at higher frequencies (e.g., 5 MHz and higher), and on the order of 30 dB lower than spectrum 422 for a dither signal d(t) generated from a 2-bit PRBS sequence but not filtered by a noise-shaping filter.

Additionally, dither generation circuit 500 constructed as shown in FIG. 5A according to this example embodiment provides a dither signal d(t) that, when quantized by a downstream ADC, is uniformly distributed over its possible values. FIG. 5C illustrates a normalized histogram of the distribution of quantized values based on a dither sequence D[k] generated by the two sigma-delta modulators 502[1], 502[0] of dither generation circuit 500 in the example implementation of FIG. 5A. According to this implementation, each modulator 502[1], 502[0] generates "1" and "0" data states with equal probability, resulting in the 2-bit digital dither sequence D[k] having four possible data states $\{00, 01, 10, 11\}$ with uniform probabilities. This uniform distribution of dither sequence D[k] values as generated by sigma-delta modulators 502[1], 502[0] of dither generation circuit 500 maintains the maximum input signal amplitude that can be supported by ADC 100. In addition, the noise-shaping provided by those modulators results in a dither signal d(t) that reduces multiplicative phase noise from the analog-to-digital conversion of an analog input signal at frequencies close-in to the fundamental tone of the input signal. This noise-shaping attribute along with the maximum input signal amplitude maintained by the uniform histogram can thus attain good SFDR performance and good close-in phase noise in the ADC circuit module.

It is further contemplated that more than two 1-bit sigma-delta modulators may be implemented in a dither generation circuit generating a digital dither sequence. For example, three 1-bit sigma-delta modulators arranged in the manner of FIG. 5A will generate a digital sequence D[k] of 3-bit data words. Such alternative implementations are contemplated to also provide noise-shaping in the form of a high-pass spectrum in the analog dither signal, from a digital sequence D[k] with a uniform probability distribution over the available quantization levels (e.g., eight quantization levels for a 3-bit sequence).

Alternatively, the dither generation circuit may utilize a single 2-bit sigma-delta modulator to generate a digital dither sequence D[k] of 2-bit digital words, in place of the pair of 1-bit modulators 502[1], 502[0] as described above relative to FIG. 5A. The resulting analog dither signal d(t) generated from this 2-bit sigma-delta modulator will exhibit a high-pass frequency spectrum in the same manner as described above relative to FIG. 5A and FIG. 5B and can thus reduce close-in phase noise for the analog-to-digital conversion of an analog input signal. It has been observed, however, that the digital sequence generated by a single 2-bit sigma-delta modulator will not be uniformly distributed over its four possible data states $\{00, 01, 10, 11\}$. As such, generation of a digital dither sequence using multiple 1-bit sigma-delta modulators will be advantageous over a single 2-bit (or other multiple-bit) modulator architecture from the standpoint of SFDR performance.

According to these example embodiments, an ADC circuit module is provided in which band-limited dither for addition to an analog input signal can be generated to reduce multiplicative noise in the power spectrum of the output digital sequence, specifically to reduce phase noise at frequencies close-in to a fundamental or carrier tone in the input signal. These example embodiments can also provide improvement in both measures of spurious-free dynamic range (SFDR) and signal-to-noise ratio (SNR) of these ADC circuit modules.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device, or other electronics or semiconductor component.

Unless otherwise stated, "about," "approximately," or "substantially" preceding a value means +/−10 percent of the stated value or, if the value is zero, a reasonable range of values around zero. Modifications are possible in the described examples, and other examples are possible within the scope of the claims.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. While, in some example embodiments, certain elements are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

While one or more embodiments have been described in this specification, it is of course contemplated that modifications of, and alternatives to, these embodiments, such modifications and alternatives capable of obtaining one or more of the technical effects of these embodiments, will be apparent to those of ordinary skill in the art having reference to this specification and its drawings. It is contemplated that such modifications and alternatives are within the scope of the claims presented herein.

What is claimed is:

1. An apparatus comprising:
    an analog-to-digital converter (ADC) having an analog input and a digital output;
    an adder having an analog input, having a dither input, and having an analog output coupled to the analog input of the ADC; and
    a dither generation circuit including:
        an analog dither signal generator having an output; and
        an analog high-pass filter and an analog low-pass filter coupled in series between the output of the analog dither signal generator and the dither input of the adder.

2. The apparatus of claim 1, wherein:
    the analog high-pass filter has an input coupled to the output of the analog dither signal generator and has an output; and
    the analog low-pass filter has an input coupled to the output of the analog high-pass filter circuit and has an output coupled to the dither input of the adder.

3. The apparatus of claim 1, wherein:
    the analog low-pass filter has an input coupled to the output of the analog dither signal generator and has an output; and
    the analog high-pass filter has an input coupled to the output of the analog low-pass filter circuit and has an output coupled to the dither input of the adder.

4. The apparatus of claim 1, wherein the dither generation circuit includes:
    an amplifier having an output coupled to the dither input of the adder and having an input coupled to an output of the low-pass filter or to an output of the high-pass filter.

5. An apparatus comprising:
    an analog-to-digital converter (ADC) having an analog input and a digital output;
    an adder having an analog input, having a dither input, and having an analog output coupled to the analog input of the ADC; and
    a dither generation circuit including:
        a digital dither signal generator having an output;
        a digital high-pass filter having an input coupled to the output of the digital dither signal generator, and having an output;
        a digital-to-analog converter (DAC) having an input coupled to the output of the digital high-pass filter and having an output; and
        an analog low-pass filter having an input coupled to the output of the DAC and having an output coupled to the dither input of the adder.

6. The apparatus of claim 5, wherein the digital high-pass filter is a second order digital high-pass filter.

7. The apparatus of claim 5, wherein the digital dither signal generator includes a pseudo-random binary sequence (PRBS) generator.

8. The apparatus of claim 5, wherein the dither generation circuit includes:
    an amplifier having an input coupled to the output of the analog low-pass filter and having an output coupled to the dither input of the adder.

9. The apparatus of claim 7, wherein the PRBS generator is configured to generate a 1-bit sequence.

10. The apparatus of claim 6, wherein the digital dither signal generator includes a pseudo-random binary sequence generator configured to generate a 1-bit sequenced.

11. A circuit, comprising:
    an analog-to-digital converter (ADC) having an analog input and a digital output;
    an adder having an analog input, having a dither input, and having an analog output coupled to the analog input of the ADC; and
    a dither generation circuit including:
        a first sigma-delta modulator having an output;
        a second sigma-delta modulator having an output; and
        a digital-to-analog converter (DAC) having a first input coupled to the output of the first sigma-delta modulator, having a second input coupled to the output of the second sigma-delta modulator, and having an output coupled to the dither input of the adder.

12. The circuit of claim 11, wherein the first and second sigma-delta modulators are each 1-bit sigma-delta modulators.

13. The circuit of claim 11, wherein the dither generation circuit includes:
    an analog low-pass filter having an input coupled to the output of the DAC and having an output coupled to the dither input of the adder.

14. The circuit of claim 13, wherein the dither generation circuit includes:
    an amplifier having an input coupled to the output of the analog low-pass filter and having an output coupled to the dither input of the adder.

15. The circuit of claim 11, wherein the adder is a first adder, and each of the first and second sigma-delta modulators includes:

a pseudo-random bit sequence (PRBS) generator having an output;
a second adder having a first input coupled to the output of the PRBS generator, having a second input, and having an output;
a 1-bit quantizer having an input coupled to the output of the second adder and having an output coupled to the first or the second inputs of the DAC;
a third adder having an input coupled to the output of the 1-bit quantizer and having an output; and
an integrator having an input coupled to the output of the third adder and having an output coupled to the second input of the second adder.

* * * * *